United States Patent
Gray et al.

(10) Patent No.: US 7,584,400 B2
(45) Date of Patent: Sep. 1, 2009

(54) CLASH-FREE IRREGULAR-REPEAT-ACCUMULATE CODE

(75) Inventors: Paul Kingsley Gray, San Diego, CA (US); Keith Michael Chugg, La Canada, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 586 days.

(21) Appl. No.: 11/404,499

(22) Filed: Apr. 14, 2006

(65) Prior Publication Data

US 2007/0011566 A1    Jan. 11, 2007

Related U.S. Application Data

(60) Provisional application No. 60/671,942, filed on Apr. 15, 2005.

(51) Int. Cl.
*H03M 13/00* (2006.01)
(52) U.S. Cl. .................. 714/755; 714/786; 714/801; 714/762; 714/788; 714/790
(58) Field of Classification Search .................. 714/755, 714/786, 790, 762, 788, 801
See application file for complete search history.

(56) References Cited

U.S. PATENT DOCUMENTS

| | | | |
|---|---|---|---|
| 6,392,572 B1 | 5/2002 | Shiu et al. | |
| 2004/0199859 A1* | 10/2004 | Matsumoto | 714/801 |
| 2006/0036930 A1* | 2/2006 | Luby et al. | 714/786 |
| 2006/0242530 A1* | 10/2006 | Lu et al. | 714/752 |
| 2007/0143657 A1* | 6/2007 | Kanaoka et al. | 714/752 |

FOREIGN PATENT DOCUMENTS

| | | |
|---|---|---|
| WO | WO 2004040829 A | 5/2004 |
| WO | WO 2005/036758 A | 4/2005 |
| WO | WO 2005/096510 A | 10/2005 |

OTHER PUBLICATIONS

Chugg et al. "Flexible Coding for 802.11n MIMO Systems" Sep. 2004, www.trellisware.com/11-04-0593-04-000n-flexible-coding-802-11n-mimo-systems.pdf.

(Continued)

*Primary Examiner*—Guy J Lamarre
(74) *Attorney, Agent, or Firm*—Townsend and Townsend and Crew LLP

(57) ABSTRACT

Methods, apparatuses, and systems are presented for performing data encoding involving receiving a sequence of data bits, encoding the sequence of data bits in accordance with a parity check matrix (H-matrix) to generate a sequence of encoded bits, wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1, wherein the second matrix is capable of being expressed as a product of a parity check matrix, an interleaver permutation matrix, and a repeat block matrix, and the interleaver permutation matrix satisfies a clash-free interleaver constraint, and outputting the sequence of encoded bits.

21 Claims, 11 Drawing Sheets

OTHER PUBLICATIONS

Giulietti et al. "Parallel turbo coding interleavers: avoiding collisions in accesses to storage elements", Electonics Letters, IEE Stevenage, GB, vol. 38, No. 5, Feb. 28, 2002 pp. 232-234.

Johnson et al. "Interleaver and Accumulator Design for Systematic Repeat-Accumulate Codes", Communications Theory Workshop, 2005, Proceedings, 6th Australian Brisbane, Australia Feb. 2-4, 2005, Piscataway, NJ, IEEE, pp. 1-7.

Mansour, "High-performance decoders for regular and irregular repeat-accumulate codes" Global Telecommunications Conference 2004, Globecom 2004, IEEE, Dallas Texas, Nov. 29, 2004-Dec. 3, 2004, pp. 2583-2588.

Ryan, "An Introduction to LDPC Codes," in CRC Handbook for Coding and Signal Processing for Recording Systems (B. Vasic, ed.) CRC Press retrieved from http://www.ece.arizona.edu/~ryan/New%20Folder/ryan-crc-ldpc-chap.pdf on Aug. 29, 2006.

Trellisware Technologies Inc. "Flexicodes: A Highly Flexible FEC Solution" Jul. 27, 2004 retrieved from the internet at http://web.archive.org/web2004072045022/trellisware.com/trellisware_flexicode_whitepaper.pdf retrieved on Jul. 28, 2006, Jul. 24, 2004.

Trellisware Technolgies Inc. "Forward error correction", Feb. 13, 2005, retrieved from the internet http://web.archive.org/web/20050213043231/http://trelisware.com/fec.htm retrieved on Jul. 28, 2006.

Yang et al. "Design of Efficiently Encodable Moderate-Length High-Rate Irregular LDPC Codes" IEEE Tranasctions on Communications, vol. 52, No. 4.

Yanping et al, "New Implementation for the scalable LDPC-decoders", Vehicular Technology Conference, 2004 VTC 2004-Spring. 2004 IEEE 59th Milan Italy May 17-19, 2004, Piscataway, NJ USA IEEE vol. 1.

* cited by examiner

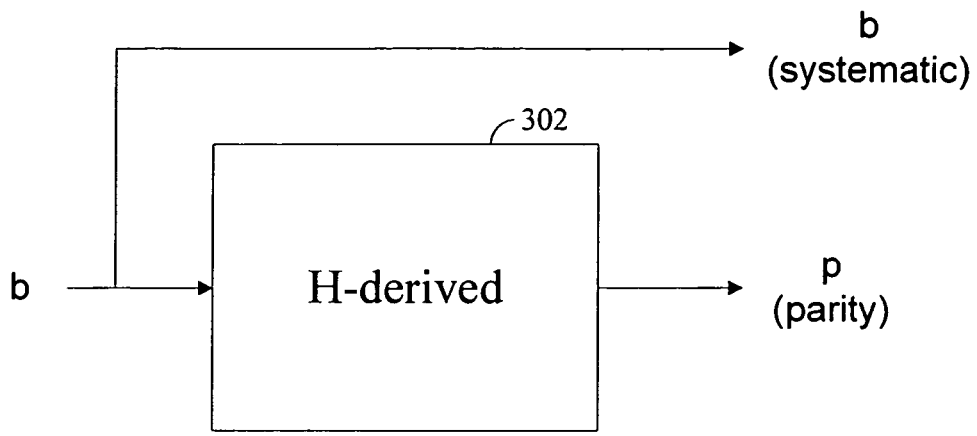
FIG. 3A
$$H = [H_p | H_d] = \begin{bmatrix} 1 & 0 & 0 & \cdots & 0 & h_1^t \\ 1 & 1 & 0 & \cdots & 0 & h_2^t \\ 0 & 1 & 1 & \cdots & 0 & h_3^t \\ 0 & 0 & 1 & \ddots & 0 & h_4^t \\ \vdots & & & \ddots & 0 & \vdots \\ 0 & 0 & 0 & 1 & 1 & h_{n-k}^t \end{bmatrix}$$
FIG. 3B
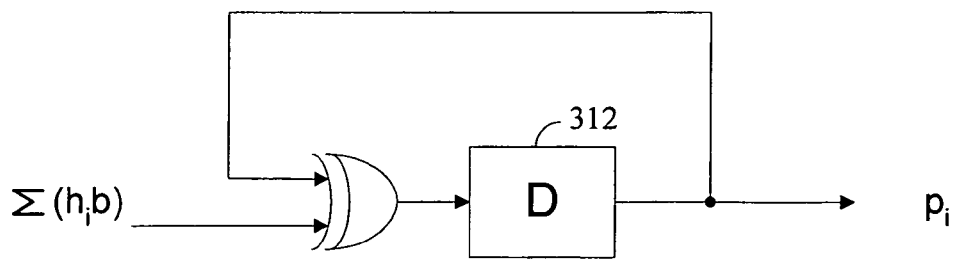
FIG. 3C S: dual-diagonal accumulator block (N-K x N-K)
D: lower-diagonal block (N-K x N-K)
T: repeat block (QK x K)
P: permutation of interleaver (QK x QK)
J: SPC mapping (N-K x QK)

$$N-K \begin{bmatrix} S & | & JPT \\ & | & \\ N-K & | & K \end{bmatrix} \begin{bmatrix} p \\ b \end{bmatrix} = 0$$

Low Density Parity Check: $Hc = 0$ $$S = \begin{bmatrix} 1\,0\,0\,\ldots\,0\,0\,0 \\ 1\,1\,0\,0\,\ldots\,0\,0\,0 \\ 0\,1\,1\,0\,0\,\ldots\,0\,0 \\ 0\,0\,1\,1\,0\,0\,\ldots\,0 \\ 0\,0\,0\,1\,1\,0\,\ldots\,0 \\ \\ 0\,0\,\ldots\,0\,0\,1\,1\,0 \\ 0\,0\,0\,\ldots\,0\,0\,1\,1 \end{bmatrix}$$
(N-K x N-K)

$$D = \begin{bmatrix} 1\,0\,0\,\ldots\,0\,0\,0 \\ 1\,1\,0\,0\,\ldots\,0\,0\,0 \\ 1\,1\,1\,0\,0\,\ldots\,0\,0 \\ 1\,1\,1\,1\,0\,0\,\ldots\,0 \\ 1\,1\,1\,1\,1\,0\,\ldots\,0 \\ \\ 1\,1\,\ldots\,1\,1\,1\,1\,0 \\ 1\,1\,1\,\ldots\,1\,1\,1\,1 \end{bmatrix}$$
(N-K x N-K)

$$P = \begin{bmatrix} 0\,0\,0\,0\,\ldots\,1\,0\,0 \\ 0\,0\,0\,1\,\ldots\,0\,0\,0 \\ 1\,0\,0\,0\,0\,\ldots\,0\,0 \\ \\ 0\,0\,\ldots\,1\,0\,0\,0\,0 \\ 0\,1\,0\,\ldots\,0\,0\,0\,0 \end{bmatrix}$$
(pseudo-random permutation matrix)
(QK x QK)

$$T = \begin{bmatrix} 1\,0\,0\,\ldots\,0\,0\,0 \\ 1\,0\,0\,0\,\ldots\,0\,0\,0 \\ \vdots \\ 1\,0\,0\,0\,0\,0\,\ldots\,0 \\ 0\,1\,0\,0\,0\,0\,\ldots\,0 \\ 0\,1\,0\,0\,0\,0\,\ldots\,0 \\ \vdots \\ 0\,1\,0\,0\,0\,0\,\ldots\,0 \\ \vdots \\ 0\,0\,\ldots\,0\,0\,0\,1 \\ 0\,0\,\ldots\,0\,0\,0\,1 \\ \vdots \\ 0\,0\,\ldots\,0\,0\,0\,1 \end{bmatrix} \begin{matrix} \big\} Q_1 \\ \\ \big\} Q_2 \\ \\ \big\} Q_k \end{matrix}$$
(QK x K)

$$J = \begin{bmatrix} \overbrace{1\,1\,\ldots\,1}^{J} & & & & \mathbf{0} \\ & 1\,1\,\ldots\,1 & & & \\ & & 1\,1\,\ldots\,1 & & \\ & & & 1\,1\,\ldots\,1 & \\ \mathbf{0} & & & \ldots & \\ & & & & 1\,1\,\ldots\,1 \end{bmatrix}$$
(N-K x QK)

$$H = \begin{bmatrix} S & JPT \end{bmatrix}$$

FIG. 5

- M consecutive values in the input frame are generated in parallel
- Each of these is written to different memory sub-banks
- M consecutive values in the output frame are accessed in parallel
- Each of these must be read from different memory sub-banks
- For each $j_1$ and $j_2$ from the same group of M values in the output frame $\pi(j_1)\%M \neq \pi(j_2)\%M$

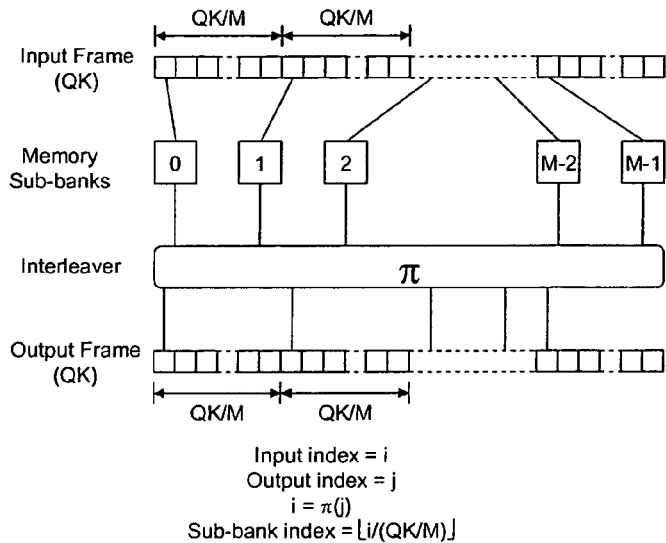

- M values in the input frame spaced QK/M apart are generated in parallel
- Each of these is written to different memory sub-banks
- M values in the output frame spaced QK/M apart are accessed in parallel
- Each of these must be read from different memory sub-banks
- For each $j_1$ and $j_2$ separated by QK/M in the output frame $\lfloor \pi(j_1)/(QK/M) \rfloor \neq \lfloor \pi(j_2)/(QK/M) \rfloor$

FIG. 7

$$\mathbf{H_d} = \begin{bmatrix} \boxed{\begin{array}{c} 1\ 0\ 1\ 0\ \ldots\ 0\ 0\ 0 \\ 0\ 0\ 0\ 0\ \ldots\ 0\ 1\ 0 \\ \ldots \\ 0\ 1\ 0\ 0\ 0\ \ldots\ 0 \end{array}} \overset{\text{Column weight} \leq 1}{} \\ 0\ 0\ 0\ 1\ 0\ 0\ \ldots\ 0 \\ 0\ 1\ 0\ 0\ 0\ 0\ \ldots\ 0 \\ \ldots \\ 1\ 0\ 0\ 0\ 0\ 0\ \ldots\ 0 \\ \ldots \\ 0\ 0\ \ldots\ 0\ 1\ 0\ 0\ 0 \\ 0\ 1\ \ldots\ 0\ 0\ 0\ 0\ 0 \\ \ldots \\ 0\ 0\ \ldots\ 0\ 0\ 1\ 0\ 1 \end{bmatrix} \begin{matrix} \updownarrow Z \\ \\ \updownarrow Z \\ \\ \updownarrow Z \end{matrix}$$

Rate ½ Example IRA Interleaver

- If $v_{in}$ is the input vector to the interleaver and $v_{out}$ is the output vector, then $$v_{out}(i) = v_{in}(\pi(i)), \text{ for } i=0\ldots5831$$

where $\pi$ is the 5832 long interleaver vector

- The interleaver is completely defined by the first 54 values and an offset $$\pi(i+54j) = (\pi(i) + 17442j) \text{ MOD } 5832,$$
$$\text{for } i=0\ldots53 \text{ and for } j=0\ldots107$$

- The first 54 values are given by $\pi(0\ldots53)=\{1622,5173,311,1270,3191,29,3513,5791,1587,4189,601,2249,4848,1905,$
$3860,3197,4823,3925,3613,3265,2266,2878,2282,2544,346,981,4806,919,645,5488,$
$4520,1286,2584,3838,4490,2969,4168,3543,936,2898,1922,5177,320,4206,688,1968,$
$5149,4494\}$

FIG. 9

Rate ½ Example H Matrix

- Start with the 9×6 seed matrix $H_{seed}$ $$H_{seed} = \begin{bmatrix} 1622 & 5173 & 311 & 1270 & 3191 & 29 \\ 3513 & 5791 & 1587 & 4189 & 601 & 2249 \\ 4848 & 1905 & 3860 & 3197 & 4823 & 3925 \\ 3613 & 3265 & 2266 & 2878 & 2282 & 2544 \\ 346 & 981 & 4806 & 919 & 645 & 5488 \\ 4520 & 1286 & 2584 & 3838 & 4490 & 2969 \\ 4168 & 3543 & 936 & 2898 & 1922 & 5177 \\ 320 & 4206 & 688 & 1968 & 5149 & 4494 \end{bmatrix}$$

- The 972×6 matrix $H_1$ is formed from 108 sub-matrices of $(H_{seed}+17442j)$ MOD 5832, where j is the sub-matrix index
- Form the 972×6 matrix $H_2 = \lfloor a_i + (H_1 - b_i)/Q_i \rfloor$, where $a_1=0$, $b_1=0$, $Q_1=9$ if the element of $H_1$ is <4374, and $a_1=486$, $b_2=4373$, $Q_2=3$ otherwise
- $H_2$ gives the column positions of ones in $H_d$
- Simpler construction of H possible if the repeats are alternated

FIG. 10

CLASH-FREE IRREGULAR-REPEAT-ACCUMULATE CODE

CROSS-REFERENCES TO RELATED APPLICATIONS

This application claims the benefit of and is a non-provisional of U.S. patent application Ser. No. 60/671,942 filed on Apr. 15, 2005, which is hereby expressly incorporated by reference in its entirety for all purposes.

BACKGROUND OF THE INVENTION

The transmission of data through a noisy channel could introduce errors into the data stream. In order to reduce the amount of errors in the data sequence reconstructed after transmission through the channel, coding techniques have been developed that provide the ability to correct such errors. This is achieved usually through the addition of redundant information as part of the transmission. Here the term transmission is used broadly to include transfer of data through different types of medium. This can include communication mediums such as those used in wired, wireless, satellite, and other technologies. This can also include storage mediums such as magnetic, semiconductor, and other types of memory.

Forward error correction (FEC) allows data to be transmitted through such noisy channels by correcting providing error correction capability. Generally speaking, FEC involves encoding the source data into encoded data at the transmitter. The transmitter sends the encoded data through the noisy channel which introduces errors. At the receiver, the data received from the channel is decoded to remove errors to the extent the FEC is capable, producing a reconstructed version of the original source signal. The type of FEC coding used can greatly affect the error correction performance of the system.

Some of the most popular and powerful FEC coding techniques known today include irregular-repeat-accumulate (RA) codes and low density parity check codes (LDPC). As is known in the art, IRA codes are characterized by the encoding steps of repeating the source data, performing an interleaving or re-ordering function, and performing an accumulation function. Also, as is known in the art, LDPC codes are characterized by a parity check matrix, often referred to as an H-matrix, which defines the encoding performed on the source signal.

IRA codes and LDPC codes have their individual advantages. Up to now, an implementation of an FEC communication system needing to utilize the power of either IRA or LDPC codes has had to make a decision to either build the entire system around either an IRA code or an LDPC code. Such rigidity means that the specification of an FEC code design would dictate the type of code used, instead of allowing the system designer to choose the optimal types of encoding and decoding structures in either the IRA or LDPC format, based on attributes that are most important to the system. There may be scenarios in which the choice of the code as either IRA or LDPC can vary depending on particular needs or limitations of a system. Thus, there is a significant need for techniques that allow system designers to make flexible choices between IRA codes and LDPC codes.

BRIEF SUMMARY OF THE INVENTION

The present invention relates to methods, apparatuses, and systems for performing data encoding involving receiving a sequence of data bits, encoding the sequence of data bits in accordance with a parity check matrix (H-matrix) to generate a sequence of encoded bits, wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1, wherein the second matrix is capable of being expressed as a product of a parity check matrix, an interleaver permutation matrix, and a repeat block matrix, and the interleaver permutation matrix satisfies a clash-free interleaver constraint, and outputting the sequence of encoded bits.

The encoding step may be performed using an irregular-repeat-accumulate (IRA) encoder comprising an irregular repetition encoder, an interleaver, a single parity check encoder (SPC), and an accumulator. The encoding step may also be performed using an irregular-repeat-accumulate (IRA) encoder comprising an irregular repetition encoder, an interleaver, an accumulator, and a bit puncture unit. Further, the encoding step may be performed using a low density parity check (LDPC) encoder.

The clash-free interleaver constraint may support clash-free window decoder operation, clash-free tile decoder operation, or both clash-free window decoder operation and clash-free tile decoder operation In one embodiment, the code is selected by finding a particular parity check matrix satisfying the clash-free interleaver constraint, computing a corresponding second matrix based on the particular parity check matrix, and evaluating whether the corresponding second matrix comprises one or more vertically stacked sub-matrices such that each sub-matrix consists of a plurality of columns, with each column having a column weight of no more than 1.

In another embodiment, the code is selected by finding a particular second matrix comprising one or more vertically stacked sub-matrices such that each sub-matrix consists of a plurality of columns, with each column having a column weight of no more than 1, computing a corresponding parity check matrix based on the second matrix, and evaluating whether the parity check matrix satisfies the clash-free interleaver constraint.

The present invention relates to methods, apparatuses, and systems for performing data decoding involving receiving a sequence of encoded bits, decoding the sequence of encoded bits in accordance with a parity check matrix (H-matrix) to generate a sequence of decoded bits, wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1, wherein the second matrix is capable of being expressed as a product of a parity check matrix, an interleaver permutation matrix, and a repeat block matrix, and the interleaver permutation matrix satisfies a clash-free interleaver constraint, and outputting the sequence of decoded bits.

BRIEF DESCRIPTION OF THE DRAWINGS

FIG. 3A is a block diagram of an encoder implemented as a low density parity check (LDPC) encoder according to an embodiment of the invention.

FIG. 3B illustrates the structure of a parity check matrix H, according to an embodiment of the present invention.

FIG. 3C shows a circuit that can be used in the implementation of a block within the LDPC encoder of FIG. 3A.

FIG. 5 presents matrices of an IRA code shown with illustrative values.

FIG. 7 illustrates a tile decoder clash-free constraint, according to one embodiment of the invention.

FIG. 8 illustrates an LDPC H-matrix layered belief propagation constraint, according to an embodiment of the invention.

FIG. 9 presents an example of an IRA interleaver for a rate 1/2 code.

FIG. 10 presents an example of a parity check matrix H for a rate 1/2 code corresponding to the IRA interleaver described in FIG. 9.

DETAILED DESCRIPTION OF THE INVENTION

System Description

Figure 1:
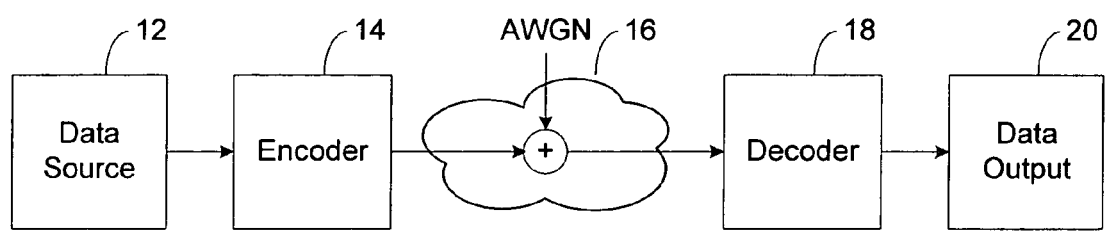
FIG. 1 shows a digital communication system according to an embodiment of the present invention.

FIG. 1 shows a digital communication system 10 according to an embodiment of the present invention. Digital communication system 10 includes a data source 12 providing symbols defined on a closed set of symbols. For example, if a binary closed set of symbols is used, the symbols are selected from {0, 1}. Data source 12 may be the originator of the symbols. Alternatively, data source 12 may be an input interface that receives the symbols from another source. The symbols from the data source 12 are forwarded to encoder 14, which converts the symbols into encoded symbols according to the structure of encoder 14. The encoded symbols are then sent through a channel 16, which can add noise, such as additive white Gaussian noise (AWGN), and distortions to the encoded symbol to produce a received signal. Soft information relating to the received signal is sent to a decoder 18. Decoder 18 outputs soft information regarding the symbols which can be thresholded to produce hard-decision decoded symbols. The decoded symbols are forwarded to a data output 20. Data output 20 may be a final destination for the decoded symbols. Alternatively, data output 20 may be an output interface that outputs the decoded symbols to another destination.

The digital communication system shown in FIG. 1 is a functional block diagram providing an illustrative example of basic functions. Different functions may be added or omitted. Also, application of the innovative methods discussed herein is not limited to this specific block diagram. Similarly, other block diagrams discussed below are merely illustrative examples and do not limit the applicability of the methods discussed herein.

IRA Encoder

Figure 2A:
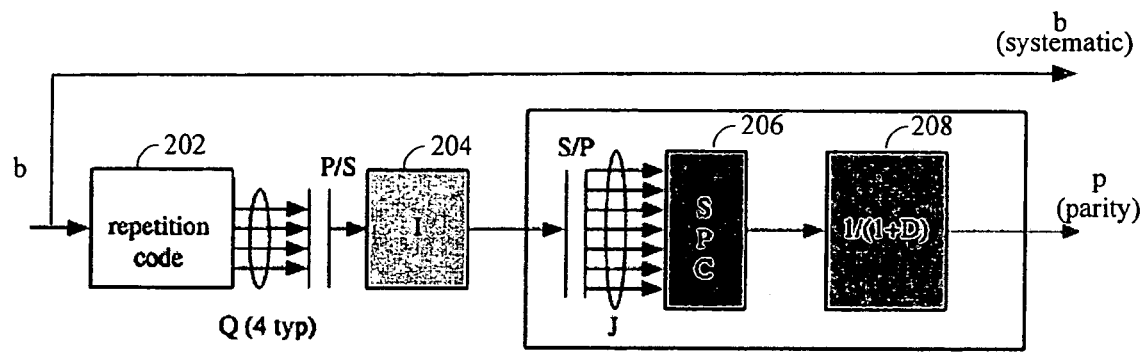
FIG. 2A is a block diagram of an encoder implemented as an irregular-repeat-accumulate (IRA) encoder according to an embodiment of the invention.

FIG. 2A is a block diagram of encoder 14 implemented as an irregular-repeat-accumulate (IRA) encoder according to an embodiment of the invention. IRA encoder 14 comprises a repetition code block 202, an interleaver 204, a single parity check block 206, and an accumulator 208. Here and in later sections, all symbols are described as being binary symbols, or bits. This includes source symbols, encoded, symbols, and decoded symbols. However, it should be understood that the invention is not necessarily limited to binary symbols. The rate of this IRA code is K/N. That is, for every K source bits, N encoded bits are generated.

IRA encoder 14 represents a systematic code. This means that the encoded bits comprise two parts, systematic bits and parity bits. The systematic bits are identical to the source bits. The parity bits are generated based on the source bits. Here, the systematic bits (which are the source bits) are referred to as "b." The parity bits are referred to as "p."

As shown in the FIGURE, generation of the systematic bits "b" by IRA encoder 14 is trivial. The source bits are simply forwarded to produce the systematic bits. Generation of the parity bits "p" by IRA encoder 14 is described below.

First, the source bits are provided to repetition code block 202. Repetition code block 202 generates an output that is formed by repeating each source bit a number of times ("Q"). The number of times each source bit is repeated, Q, can vary. Q may be selected from amongst a plurality of predetermined values. Even though Q varies, it may attain an average value over time. In the embodiment shown in this FIGURE, the average value of Q is 4. According to a different embodiment of the invention, Q is fixed a particular value and does not change.

According to an embodiment of the invention, the output of repetition code block 202 is provided to interleaver 204. Here, the output of repetition block 202 is generated in parallel format, converted to serial format, then provided to interleaver 204. Specifically, every group of Q parallel bits is converted into Q serial bits. Interleaver 204 interleaves, or re-orders the data according to a known pattern.

The output of interleaver 204 is provided to single parity check block 206. Here, the output of interleaver 206 is generated in serial format, converted to parallel format, then provided to single parity check block 206. Specifically, every group of J serial bits is converted into J parallel bits. Single parity check block 206 performs a single parity check on each set of J bits. This can be implemented by performing an XOR operation on the J bits. According to one embodiment of the invention, J is a fixed number. According to another embodiment of the invention, J is time-varying.

Finally, the output of single parity check block 206 is provided to accumulator 208. Accumulator 208 performs a 1-bit accumulation function. This can be implemented by performing an XOR operation on each current bit and the previous result. The output bits from accumulator 208 is generated as the parity bits "p."

Although not shown in FIG. 2A, the combination of parity check block 206 followed by accumulator 208 can be replaced by an accumulator followed by a 1-of-J bit puncture circuit, according to another embodiment of the invention.

Figure 2B:
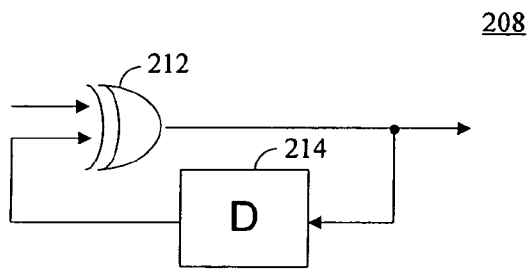
FIG. 2B shows an implementation of an accumulator of an IRA encoder according to an embodiment of the invention.

FIG. 2B shows an implementation of accumulator 208 according to an embodiment of the invention. Here, accumulator 208 comprises an XOR gate 212 and a D flip-flop 214. The bit arriving at accumulator 208 is provided to the first input to XOR gate 212. The previous output of accumulator 208 is stored in D flip-flop 214 and is provided to the second input of XOR gate 212. The output of XOR gate 212 is provided as the current output of the accumulator. The output of XOR gate 212 is also stored into D flip-flop in preparation for performing the next iteration when the next bit arrives at accumulator 208.

Figure 2C:
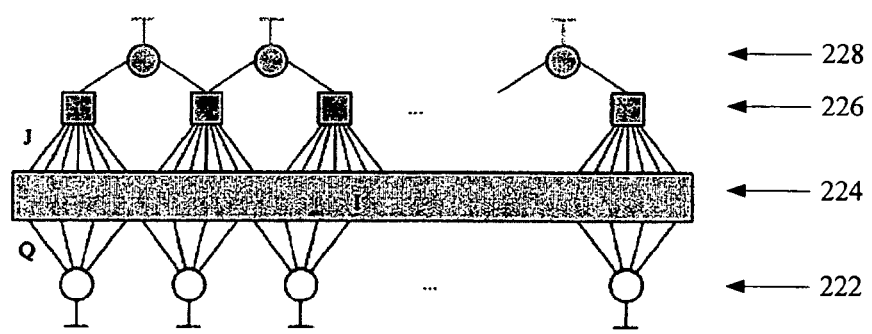
FIG. 2C presents a graphical model of an IRA encoder.

FIG. 2C presents a graphical model of IRA encoder 14. The graphical model comprises a repetition stage 222, an interleaver stage 224, a single parity check stage 226, and an accumulator stage 228. The source bits are first processed by repetition stage 222. Here, repetition stage 222 repeats each source bit Q times. Next, the repeated bits are processed by interleaver stage 224, which performs an interleaving or re-ordering function. The interleaved bits are processed, in groups of J bits, by single parity check stage 226. The parity check bits are then processed by accumulator stage 228. The output of accumulator state 228 is the parity bits "p." Again, the source bits are simply forwarded to generate the systematic bits "b."

LDPC Encoder

FIG. 3A is a block diagram of encoder 14 implemented as a low density parity check (LDPC) encoder according to an embodiment of the invention. The rate of this LDPC code is K/N. That is, for every K source bits, N encoded bits are generated.

LDPC encoder 14 represents a systematic code. Again, this means that the encoded bits comprise two parts, systematic bits and parity bits. The systematic bits are identical to the source bits. The parity bits are generated based on the source bits. Here, the systematic bits (which are the source bits) are referred to as "b." The parity bits are referred to as "p."

As shown in the FIGURE, generation of the systematic bits "b" by LDPC encoder 14 is trivial. The source bits are simply forwarded to produce the systematic bits. Generation of the parity bits "p" by LDPC encoder 14 is performed using a block 302, which is described in further detail below. The operation of block 302 is defined according to a parity check matrix H. In fact, as is known in the art, the parity check matrix H completely defines the operation of LCPC encoder 14.

FIG. 3B illustrates the structure of a parity check matrix H, according to an embodiment of the present invention. Here, parity check matrix H is shown as being capable of being partitioned into two matrices, $H_p$ and $H_d$.

The first matrix $H_p$ is a "dual diagonal" matrix. Here, a dual diagonal matrix may be a matrix comprising two diagonals of "1"s. The first diagonal of "1"s extends from the upper left corner to the lower right corner of matrix $H_d$. The second diagonal of "1"s is positions directly below the first diagonal of "1"s.

The second matrix $H_d$ is a matrix comprised of a plurality of vertically stacked sub-matrices $h_1^t, h_2^t, h_3^t, h_4^t, \ldots, h_{N-K}^t$. Here, each sub-matrix $h^t$ is expressed in transposed form, as indicated by the "t" superscript. $H_d$ is sometimes also referred to as a random matrix. $H_d$ may have an average row weight J and an average column weight Q.

FIG. 3C shows a circuit that can be used in the implementation of block 302 in FIG. 3A. As mentioned previously, the calculation of parity bits "p" is based on the parity check matrix H. This is premised on the well known relationship that exists between the parity check matrix H and the encoded bits "c," which is expressed as:

$$H * c = 0$$

Using this relationship and the following two identities:

$$H = [Hp | Hd] = \begin{bmatrix} 1 & 0 & 0 & 0 & \cdots & 0 & h_1^t \\ 1 & 1 & 0 & 0 & \cdots & 0 & h_2^t \\ 0 & 1 & 1 & 0 & & 0 & h_3^t \\ 0 & 0 & 1 & 1 & & 0 & h_4^t \\ \vdots & \vdots & & \ddots & \ddots & 0 & \vdots \\ 0 & 0 & 0 & 0 & 1 & 1 & h_{N-K}^t \end{bmatrix}$$

$$c = \begin{bmatrix} p \\ b \end{bmatrix},$$

A set of simultaneous equations can be solved for the parity bits "p," such that they are expressed in terms of the source bits "b." In fact, given the dual diagonal structure of $H_p$, the parity bits can be easily obtained. A first parity bit $p_1$ can be found initially. Thereafter, each subsequent parity bit pi can be found based on the prior parity bit $p_{i-1}$. This is expressed in the two summation equations:

$$p_1 = \sum_j h_{1j} b_j$$

$$p_i = p_{i-1} + \sum_j h_{1ij} b_j$$

Such calculations can be implemented by utilizing the simple structure shown in FIG. 3C. D flip-flop 312 stores the prior parity bit $p_i$ as is generated. The calculation of the subsequent parity bit $p_i$ is based on an XOR operation performed on the prior parity bit $p_{i-1}$ and the summation involving the appropriate sub-matrix h and the source bits "b."

IRA-LDPC Equivalence

Figure 4:
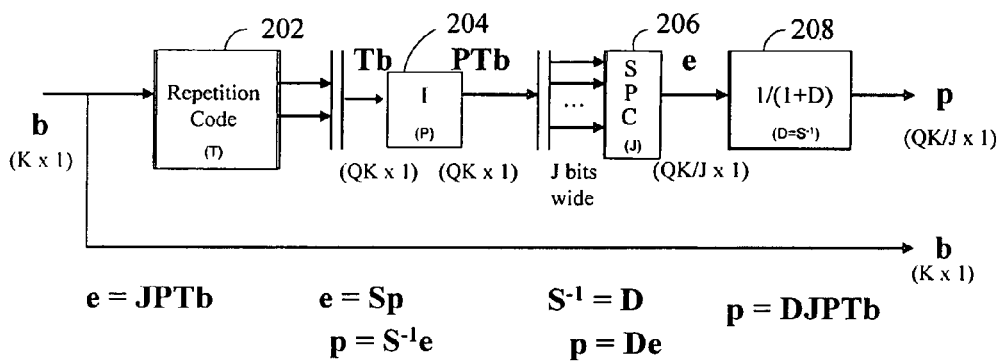
FIG. 4 illustrates an equivalence that can be found between an IRA encoder and an LDPC encoder, according to an embodiment of the invention.

FIG. 4 illustrates an equivalence that can be found between an IRA encoder and an LDPC encoder, according to an embodiment of the invention. Here, the various components of the IRA encoder shown in FIG. 2A is presented again. Each component is represented using a matrix. Thus, repetition code block 202 is represented by matrix T. Interleaver 204 is represented by matrix P. Single parity check block 206 is represented by matrix J. Accumulator 208 is represented by matrix D, which is also expressed as the matrix $S^{-1}$. The dimensions of these various matrices are shown in the FIGURE.

Specifically, S is the dual-diagonal accumulator matrix of size (N-K×N-K). D is the lower-diagonal matrix of size (N-K×N-K). T is the repeat matrix of size (QK×K). P is the interleaver permutation matrix of size (QK×QK). Finally, J is the single parity check mapping matrix of size (N-K×QK), which can be implanted by XORing J input bits to produce each output bit.

The data at each stage of the IRA encoder is also represented using a matrix (more precisely, a vector). The source bits is represented by the vector b. The output of repetition code block 202 is thus represented by the vector Tb. The output of interleaver 204 is thus represented by the vector PTb. The output of single parity check block 206 is thus represented by the vector JPTb, which is also expressed as the vector e. Finally, the output of accumulator 208 is thus represented as the vector DJPTb, which is also expressed as the vector p. The dimensions of these various vectors are shown in the FIGURE.

According to an embodiment of the invention, the IRA encoder shown here can be expressed as an equivalent LDPC encoder as follows. The matrix [S|JPT] can be equated to the parity check matrix H, expressed as H=[$H_p|H_d$]=[S|JPT]. It is known that the parity bits p and source bits b can be vertically stacked to form the code bits c, expressed as $$c = \begin{bmatrix} p \\ b \end{bmatrix}.$$

Given this, the matrices of the IRA encoder can be put into the form:

$$[S|JPT] * \begin{bmatrix} p \\ b \end{bmatrix} = 0,$$

which corresponds directly to the known form of the parity check matrix of the LDPC encoder:

$[H_p|H_d]*c=0$ $H*c=0$

An IRA code can be converted to an equivalent LDPC code as follows, according to an embodiment of the invention. Here, the $H_d$ portion of H is just S. The $H_p$ portion of H is JPT. P is completely defined by the interleaver permutation. J is completely defined by the single parity check width J. T is completely defined by the repetition code repeat values $Q_1$, $Q_2, \ldots, Q_k$.

J and T define the row and column combinations. JP can be formed by taking J rows at a time from P and adding them by modulo-2 addition. JPT can be formed by taking $Q_i$ columns at a time from JP and adding them by modulo-2 addition. If P is properly designed, $H_d$ would have row weight J and column weight $Q_i$.

An LDPC code can be converted to an IRA code as follows, according to an embodiment of the invention. If H is in the dual diagonal form $[H_p|H_d]$, then JPT is just $H_d$. P can be determined by "reversing" the row and column operations of J and T. Specifically, each weight-J row of JPT can be separated into J weight-1 rows, to form PT. Also, each weight-$Q_i$ column of PT can be separated into $Q_k$ weight-1 columns to form P. It should be noted that P is not unique. That is, the order of the J weight-1 rows and $Q_k$ weight-1 columns can be changed.

FIG. 5 presents matrices of the IRA code shown with illustrative values. As shown in the FIGURE, S is a dual diagonal matrix. D is a lower diagonal matrix. P is an interleaver permutation matrix that shows how bits are to be permuted. Here, a pseudo-random permutation pattern is shown. T is a repeat matrix of that repeats each source bit Q times. Here, Q is a value that may be different for each source bit. J is the single parity check mapping matrix, which is shown as having a stair structure.

IRAn Interleaver Clash-Free Constraint

Figure 6:
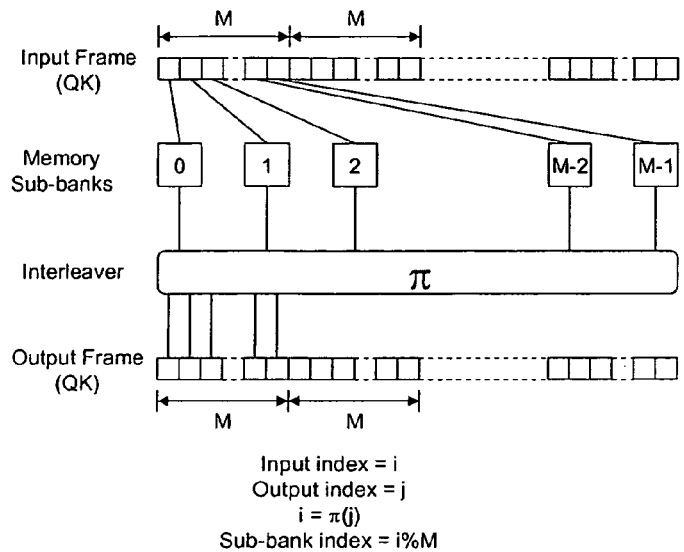
FIG. 6 illustrates a window decoder clash-free constraint, according to an embodiment of the invention.

FIGS. 6 and 7 illustrates two different types of interleaver clash-free constraints. The general operation of an interleaver in this context is briefly discussed below. A sequence of bits inputted into an interleaver is organized into frames, referred to as input frames. An example of such an interleaver is interleaver 204 shown in FIG. 2A. For each input frame, the interleaver produces a corresponding output frame. The corresponding output frame contains the same bits found in the input frame, but rearranged in a different order. Each input frame is of length QK, that is, Q times K. Thus, each output frame is also of size QK. The same interleaving function $i=\pi(j)$ is performed on each input frame to produce a corresponding output frame.

As shown in the FIGURE, the input index "i" identifies the location of a bit within an input frame. An output index "j" identifies the location of a bit within the corresponding output frame. The function $i=\pi(j)$ precisely defines the rearrangement, or interleaving used to transform the input frame into an output frame.

As a very simple example, for a frame size of QK=8, index i ranges from [0, 1, . . . , 7], and index j ranges from [0, 1, . . . , 7]. If an interleaving function $i=\pi(j)$ is defined as $0=\pi(0)$, $1=\pi(1)$, $2=\pi(2)$, $3=\pi(3)$, $7=\pi(4)$, $6=\pi(5)$, $5=\pi(6)$, and $4=\pi(7)$, then an input frame and a corresponding output frame would be produced as follows.

input frame=[a, b, c, d, e, f, g, h]

output frame=[a, b, c, d, h, g, f, e]

A frame size of QK=8 is used in this very simple example. Larger frame sizes may be implemented in an actual system.

High speed interleaving is performed by storing the bits of the input frame into memory that comprises M sub-banks. The output frame is then generated by reading from the memory, M bits at a time. Specifically, in each cycle, M bits of the output frame can be read out of the memory simultaneously, one from each sub-bank. The ability to generate the output frame M bits at a time essentially increases the speed of the interleaving process by a factor of M. The sub-banks of memory can be implemented in different ways.

FIG. 6 illustrates a window decoder clash-free constraint, according to an embodiment of the invention. This is a constraint on the interleaving function $i=\pi(j)$, which is represented by the interleaver permutation matrix P (of size QK×QK). Here, each input frame is divided into groups of size M. The M bits of the first group are generated in parallel and distributed to the M memory sub-banks labeled "0" through "M-1," such that each bit is stored to a separate sub-bank. The M bits of the second group can be generated and distributed to the M memory sub-banks in a similar manner. This is repeated for the third group, the fourth group, and so on. In this manner, the entire input frame is distributed to the M memory sub-banks.

Here, M consecutive values of the output frame are accessed in parallel. Specifically, a "$\pi$" block shown in the FIGURE accesses the M memory sub-banks. The block performs the function $i=\pi(j)$ by employing M individual processes that separately access the M memory sub-banks in a parallel manner, such as in one clock cycle. This requires that the M consecutive values in the output frame be located in different ones of the M memory sub-banks. This requirement is referred to here as the window decoder clash-free constraint.

In other words, the window decoder clash-free constraint requires that for each $j_1$ and $j_2$ from the same group of M consecutive values in the output frame, the memory sub-bank containing $\pi(j_1)$ not equal the memory sub-bank containing $\pi(j_2)$. The index of the memory sub-bank can be expressed as i modulo M, or i % M. Thus, for each $j_1$ and $j_2$ from the same group of M values in the output frame, the window decoder clash-free constraint can also be expressed as:

$\pi(j_1)\% M \neq \pi(j_2)\% M$

FIG. 7 illustrates a tile decoder clash-free constraint, according to one embodiment of the invention. Again, this is a constraint on the interleaving function $i=\pi(j)$, which is represented by the interleaver permutation matrix P (of size QK×QK). Here, each input frame is divided into groups of size QK/M. A first batch of M bits spaced QK/M apart from one another within the input frame are generated in parallel. This first batch of M bits are distributed to the M memory sub-banks labeled "0" through "M-1," such that each bit is stored to a separate sub-bank. A second batch of M bits spaced QK/M apart from one another within the input frame are then generated in parallel. The position of this second batch of M bits within the input frame may be offset by 1 compared to the position of the first batch of M bits within the input frame. The second batch of M bits are distributed to the M memory sub-banks in a similar manner. This is repeated for the third batch, the fourth batch, and so on. In this manner, the entire input frame is distributed to the M memory sub-banks.

Here, M values of the output frame spaced QK/M apart are accessed in parallel. Specifically, a "π" block shown in the FIGURE accesses the M memory sub-banks. The block performs the function $i=\pi(j)$ by employing M individual processes that separately access the M memory sub-banks in a parallel manner, such as in one clock cycle. This requires that the M values of the output frame spaced QK/M apart be located in different ones of the M memory sub-banks. This requirement is referred to here as the tile decoder clash-free constraint.

In other words, the tile decoder clash-free constraint requires that for each $j_1$ and $j_2$ separated by QK/M in the output frame, the memory sub-bank containing $\pi(j_1)$ not equal the memory sub-bank containing $\pi(j_2)$. The index of the memory sub-bank can be expressed as $\lfloor i/(QK/M) \rfloor$. Thus, for each $j_1$ and $j_2$ from the same group of M values in the output frame, the window decoder clash-free constraint can also be expressed as:

$$\lfloor \pi(j_1)/(QK/M) \rfloor \neq \lfloor \pi(j_2)/(QK/M) \rfloor$$

LDPC H-Matrix Layered Belief Propagation Constraint

FIG. 8 illustrates an LDPC H-matrix layered belief propagation constraint, according to an embodiment of the invention. The constraint is expressed here as a requirement on the structure of the $H_d$ matrix, wherein $H=[H_p|H_d]$ as mentioned previously. As is known in the art, to permit high speed decoding of an LDPC encoded data, the H matrix may need to constrained in the manner shown in the FIGURE, and a hybrid activation schedule may need to be used. Examples of hybrid activation schedules are well known and include "turbo decoding message passing" and "layered belief propagation." Further details of hybrid activation schedules are within the knowledge of one skilled in the art and are not discussed further here.

The layered belief propagation constraint on the H matrix is described below. Specifically, the $H_d$ matrix is shown as being comprised of a number of vertically stacked sub-matrices. Each sub-matrix has Z rows. The number of rows, Z, may change from one sub-matrix to another, according to one embodiment of the invention. The value of Z may be selected from a limited number of predetermined values. Some example values of Z may include Z=54, Z=81, Z=27, etc. According to another embodiment of the invention, the number of rows, Z, may be fixed for all sub-matrices.

Here, the layered belief propagation constraint is that each sub-matrix of $H_d$ should have a column-weight of no more than 1. This can be seen in each sub-matrix shown in the FIGURE. The total number of non-zero values in each column of a sub-matrix is no more than 1. As shown, some columns have a column-weight of 1, and some columns have a column-weight of 0. None of the columns have a column-weight greater than 1.

Adherence to this constraint allows parallel processing of Z rows simultaneously without clashes, with separate processes accessing different portions of a message memory associated with decoding of the LDPC code. Along with the use of a hybrid activation schedule as mentioned previously, such a constraint on the $H_d$ portion of the parity check matrix H facilitates high speed LDPC decoding, as would be appreciated by one of ordinary skill in the art.

Selecting Codes Satisfying Both Constraints

According to an embodiment of the invention, an FEC code can be generated such that the code satisfies both an IRA interleaver clash-free constraint and a layer belief propagation constraint. Specifically, when the code is expressed in its IRA form, capable of being represented as:

$$[S|JPT] * \begin{bmatrix} p \\ b \end{bmatrix} = 0,$$

the interleaver permutation matrix P (of size QK×QK), which represents the interleaving function $i=\pi(j)$, must be structured such that it satisfies the appropriate interleaver clash-free constraint. In addition, when the same code is expressed in its LDPC form, capable of being represented as:

$$H*c=0,$$

the parity check matrix H must be constructed such that it satisfies the appropriate layer belief propagation constraint.

To generate FEC codes that satisfy both constraints, a number of approaches may be taken according to various embodiments of the present invention. One approach involves finding an IRA interleaver that is clash-free and also has an equivalent parity check matrix that supports layered belief propagation. For example, a particular parity check matrix $H=[H_p|H_d]=[S|JPT]$ having an interleaver matrix J that satisfies the clash-free interleaver constraint may be found. Then, the corresponding $H_d$ matrix may be found. Finally, the $H_d$ matrix is evaluated to determine whether it adheres to a format such that it comprises one or more vertically stacked sub-matrices, each sub-matrix consisting of a plurality of columns, with each column having a column weight of no more than 1.

Another approach involves finding a parity check matrix that supports layered belief propagation and constraining it such that the equivalent IRA interleaver is clash-free. For example, a particular parity check matrix $H=[H_p|H_d]=[S|JPT]$ may be found having an $H_d$ matrix that adheres to a format such that it comprises one or more vertically stacked sub-matrices, each sub-matrix consisting of a plurality of columns, with each column having a column weight of no more than 1. Then, the corresponding parity check matrix H may be found. Finally, the parity check matrix H (more specifically its interleaver permutation matrix component J) is evaluated to determined whether it satisfies the clash-free interleaver constraint.

Once an FEC code is found satisfying both an interleaver clash-free constraint and a layered belief propagation constraint, appropriate encoders and decoders can be built to implement the code using well-known techniques. Encoders may be built using known IRA encoding structures or known LDPC encoding structures. Similarly, decoders may be built using known IRA decoding structures or known LDPC decoding structures. The specific designs of various IRA and LDPC encoders and IRA and LDPC decoders are well know and not further discussed here.

Importantly, a code satisfying both an interleaver clash-free constraint and a layered belief propagation constraint can be flexibly implemented, using a combination of different IRA or LDPC encoders and IRA or LDPC decoders. The IRA-LDPC equivalence established earlier makes this possible. For example, a received signal originally encoded using an IRA encoder implementing such a code may be decoded using an IRA decoder implementing the same code. Alternatively, the received signal can be decoded using an LCPC decoder implementing the same code. Because the code satisfies both the interleaver clash-free constraint and the layered belief propagation constraint, both the IRA decoder and the equivalent LDPC decoder can be built with high speed processing.

Similarly, a received signal originally encoded using an LDPC encoder implementing such a code may be decoded using an LDPC decoder implementing the same code. Alternatively, the received signal can be decoded using an IRA decoder implementing the same code. Again, because the code satisfies both the interleaver clash-free constraint and the layered belief propagation constraint, both the IRA decoder and the equivalent LDPC decoder can be built with high speed processing. Thus, the use of codes that satisfy both constraints allows for flexible selection of encoding and decoding structures in either the IRA or LDPC format, depending on particular needs or limitations of a system.

Example Code Descriptions

FIG. 9 presents an example of an IRA interleaver for a rate 1/2 code. Here, the interleaving function π is expressed as a vector of length 5832. There is repetition in the interleaver function. Accordingly, the interleaver is completely defined by the first 54 of the 5832 values along with a prescribed offset, as shown in the FIGURE. Thus, specification of the first 54 of 5832 values allows the entire interleaving function π to be defined.

FIG. 10 presents an example of a parity check matrix H for a rate 1/2 code corresponding to the IRA interleaver described in FIG. 9. This rate 1/2 code has been generated to satisfies both an interleaver clash-free constraint and a layered belief propagation constraint, according to an embodiment of the present invention. The parity check matrix H is defined based on a seed matrix $H_{seed}$, as described below.

As discussed previously, the parity check matrix can being written in partition form $H=[H_p|H_d]$. That is, the parity check matrix H is capable of being partitioned into two matrices $H_p$ and $H_d$. $H_p$ is the dual-diagonal matrix, which is already defined. $H_d$ is generated from the seed matrix $H_{seed}$ (size 9×6), as shown in the FIGURE. Specifically, an $H_1$ matrix (size 972×6) is first formed by concatenating 108 sub-matrices defined by $(H_{seed}+17442j)$ mod 5832, where j is the sub-matrix index. Next, an $H_2$ matrix (size 972×6) is formed by applying a function based on the $H_1$ matrix as defined in the FIGURE. Here, Q represents the number of times a source code is repeated by the repetition code block. As seen in the FIGURE, Q varies and takes on different values for different source bits. Once the $H_2$ matrix is obtained, it is used to define the $H_d$ matrix. Specifically, the $H_2$ matrix defines the column positions of ones in the $H_d$ matrix.

This is merely one example of a code that satisfies both an interleaver clash-free constraint and a layered belief propagation constraint, according to an embodiment of the present invention. Other codes that are not explicitly listed here may be generated that also satisfy both constraints in accordance with embodiments of the invention.

Performance

Figure 11:
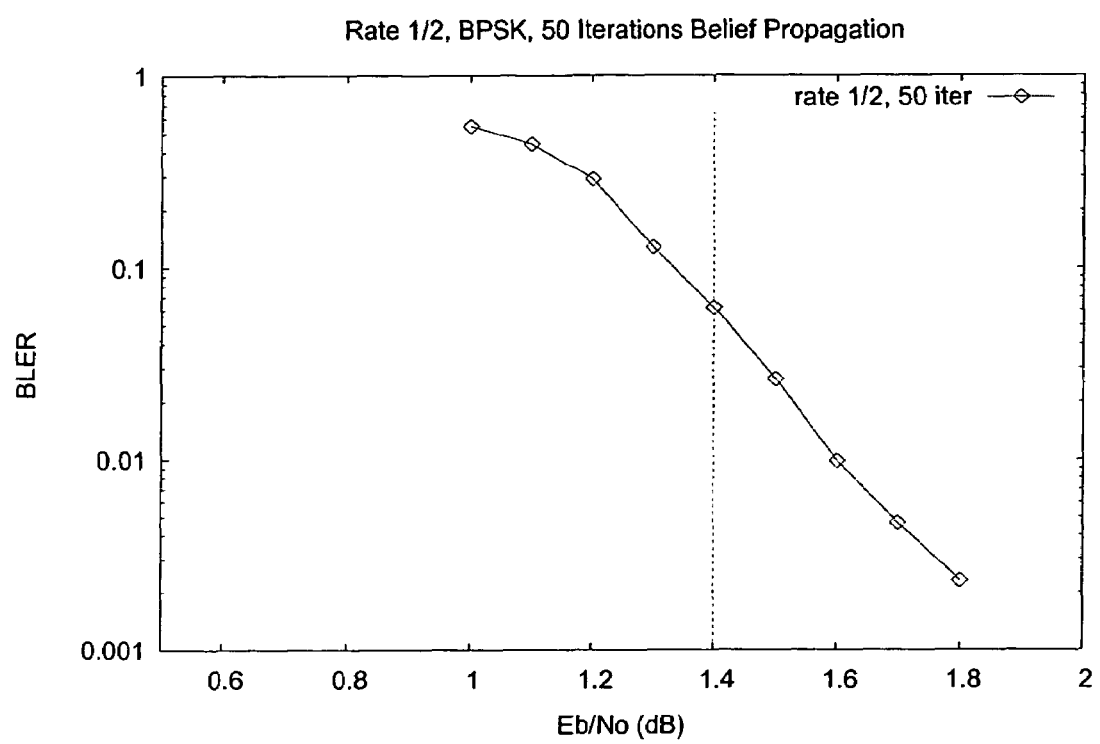
FIG. 11 is a block error rate (BLER) v. noise (Eb/N0) chart depicting the performance of a selected example code that satisfies both an interleaver clash-free constraint and a layered belief propagation constraint, according to an embodiment of the present invention.

FIG. 11 is a block error rate (BLER) v. noise (Eb/N0) chart depicting the performance of a selected example code that satisfies both an interleaver clash-free constraint and a layered belief propagation constraint, according to an embodiment of the present invention. This particular example code in its IRA format is a rate 1/2 code with K=972 and N=1944. It has an SPC with J=9, with 50% of the repeats having $Q_1=9$ and 50% of the repeats having $Q_2=3$. Thus, the average number of times a source code is repeated is Q=6. The interleaver size is QK=5832.

Here, the particular interleaver is selected as a dithered relative prime (DRP) interleaver, which is not further described, as it is well known in the art. This interleaver is generatable and clash-free for both window and tile decoders.

A search of DRP interleavers was conducted with these parameters, and their corresponding parity check matrices H determined. Only those whose corresponding parity check matrix H satisfied a layered belief propagation constraint with Z=54 and were clash-free with M=54 were selected as candidates. Out of these candidates the interleaver evaluated as having the best performance was selected. As can be seen in the figure, the selected code is characterized by excellent BLER performance in the presence of additive Gaussian white noise (AWGN).

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A computer-implemented method for performing data encoding comprising the following steps executed by one or more computer processors:

receiving a sequence of data bits;

encoding the sequence of data bits in accordance with a parity check matrix (H-matrix) to generate a sequence of encoded bits;

wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1;

wherein the second matrix is capable of being expressed as a product of a parity check matrix, an interleaver permutation matrix, and a repeat block matrix, and the interleaver permutation matrix satisfies a clash-free interleaver constraint; and outputting the sequence of encoded bits.

2. The method of claim 1 wherein the encoding step is performed using an irregular-repeat-accumulate (IRA) encoder comprising an irregular repetition encoder, an interleaver, a single parity check encoder (SPC), and an accumulator.

3. The method of claim 1 wherein the encoding step performed using an irregular-repeat-accumulate (IRA) encoder comprising an irregular repetition encoder, an interleaver, an accumulator, and a bit puncture unit.

4. The method of claim 1 wherein the encoding step is performed using a low density parity check (LDPC) encoder.

5. The method of claim 1 wherein the clash-free interleaver constraint supports clash-free window decoder operation.

6. The method of claim 1 wherein the clash-free interleaver constraint supports clash-free tile decoder operation.

7. The method of claim 1 wherein the clash-free interleaver constraint supports clash-free window decoder operation and clash-free tile decoder operation.

8. The method of claim 1 wherein the code is selected by finding a particular parity check matrix satisfying the clash-free interleaver constraint, computing a corresponding second matrix based on the particular parity check matrix, and evaluating whether the corresponding second matrix comprises one or more vertically stacked sub-matrices such that each sub-matrix consists of a plurality of columns, with each column having a column weight of no more than 1.

9. The method of claim 1 wherein the code is selected by finding a particular second matrix comprising one or more vertically stacked sub-matrices such that each sub-matrix consists of a plurality of columns, with each column having a column weight of no more than 1, computing a corresponding parity check matrix based on the second matrix, and evaluating whether the parity check matrix satisfies the clash-free interleaver constraint.

10. A computer-implemented method for performing data decoding comprising:
   receiving a sequence of encoded bits;
   decoding the sequence of encoded bits in accordance with a parity check matrix (H-matrix) to generate a sequence of decoded bits;
   wherein the H-matrix is capable of being partitioned into a first matrix and a second, matrix, the first matrix being a dual-diagonal matrix, the second matrix comprising one or more vertically stacked sub-matrices, each sub-matrix consisting of a plurality of columns, each column having a column weight of no more than 1;
   wherein the second matrix is capable of being expressed as a product of a parity check matrix, an interleaver permutation matrix, and a repeat block matrix, and the interleaver permutation matrix satisfies a clash-free interleaver constraint; and
   outputting the sequence of decoded bits.

11. An apparatus for performing data encoding comprising:
   an input interface for receiving a sequence of data bits;
   an encoder coupled to the input interface capable of encoding the sequence of data bits in accordance with a parity check matrix (H-matrix) to generate a sequence of encoded bits;
   wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1;
   wherein the second matrix is capable of being expressed as a product of a parity check matrix, an interleaver permutation matrix, and a repeat block matrix, and the interleaver permutation matrix satisfies a clash-free interleaver constraint; and
   an output interface couple to the encoder for outputting the sequence of encoded bits.

12. The apparatus of claim 11 wherein the encoder is an irregular-repeat-accumulate (IRA) encoder comprising an irregular repetition encoder, an interleaver, a single parity check encoder (SPC), and an accumulator.

13. The apparatus of claim 11 wherein the encoder is an irregular-repeat-accumulate (IRA) encoder comprising an irregular repetition encoder, an interleaver, an accumulator, and a bit puncture unit.

14. The apparatus of claim 11 wherein the encoder is a low density parity check (LDPC) encoder.

15. The apparatus of claim 11 wherein the clash-free interleaver constraint supports clash-free window decoder operation.

16. The apparatus of claim 11 wherein the clash-free interleaver constraint supports clash-free tile decoder operation.

17. The apparatus of claim 11 wherein the clash-free interleaver constraint supports clash-free window decoder operation and clash-free tile decoder operation.

18. The apparatus of claim 11 wherein the code is selected by finding a particular parity check matrix satisfying the clash-free interleaver constraint, computing a corresponding second matrix based on the particular parity check matrix, and evaluating whether the corresponding second matrix comprises one or more vertically stacked sub-matrices such that each sub-matrix consists of a plurality of columns, with each column having a column weight of no more than 1.

19. The apparatus of claim 11 wherein the code is selected by finding a particular second matrix comprising one or more vertically stacked sub-matrices such that each sub-matrix consists of a plurality of columns, with each column having a column weight of no more than 1, computing a corresponding parity check matrix based on the second matrix, and evaluating whether the parity check matrix satisfies the clash-free interleaver constraint.

20. A apparatus for performing data decoding comprising:
   an input interface for receiving a sequence of encoded bits;
   a decoder coupled to the input interface capable of decoding the sequence of encoded bits in accordance with a parity check matrix (H-matrix) to generate a sequence of decoded bits;
   wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1;
   wherein the second matrix is capable of being expressed as a product of a parity check matrix, an interleaver permutation matrix, and a repeat block matrix, and the interleaver permutation matrix satisfies a clash-free interleaver constraint; and
   an output interface coupled to the decoder for outputting the sequence of decoded bits.

21. A system for performing data encoding comprising:
   means for receiving a sequence of data bits;
   means for encoding the sequence of data bits in accordance with a parity check matrix (H-matrix) to generate a sequence of encoded bits;
   wherein the H-matrix is capable of being partitioned into a first matrix and a second matrix, the first matrix being a dual-diagonal matrix, the second matrix comprising one or more vertically stacked sub-matrices, each sub-matrix consisting of a plurality of columns, each column having a column weight of no more than 1;
   wherein the second matrix is capable of being expressed as a product of a parity check matrix, an interleaver permutation matrix, and a repeat block matrix, and the interleaver permutation matrix satisfies a clash-free interleaver constraint; and
   means for outputting the sequence of encoded bits.

* * * * *

UNITED STATES PATENT AND TRADEMARK OFFICE
CERTIFICATE OF CORRECTION

PATENT NO.       : 7,584,400 B2                    Page 1 of 1
APPLICATION NO.  : 11/404499
DATED            : September 1, 2009
INVENTOR(S)      : Gray et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 726 days.

Signed and Sealed this

Fourteenth Day of September, 2010

David J. Kappos
*Director of the United States Patent and Trademark Office*